United States Patent [19]
Ma et al.

[11] Patent Number: 6,121,809
[45] Date of Patent: Sep. 19, 2000

[54] ACCURATE AND TUNEABLE ACTIVE DIFFERENTIAL PHASE SPLITTERS IN RFIC WIRELESS APPLICATIONS

[75] Inventors: Huainan Ma, Plano, Tex.; Sher Jiun Fang; Fujiang Lin, both of Singapore, Singapore

[73] Assignee: Institute of Microelectronics, Singapore, Singapore

[21] Appl. No.: 09/270,906

[22] Filed: Mar. 15, 1999

[30] Foreign Application Priority Data

Jun. 1, 1998 [SG]  Singapore ............................ 9801167

[51] Int. Cl.$^7$ ............................................... H03K 5/13
[52] U.S. Cl. ........................ 327/246; 327/416; 327/258; 327/362
[58] Field of Search ............................ 327/231, 256, 327/259, 258, 257, 239, 415, 416, 326

[56] References Cited

U.S. PATENT DOCUMENTS

| | | | |
|---|---|---|---|
| 3,917,991 | 11/1975 | Ota et al. ................................ | 327/104 |
| 4,479,259 | 10/1984 | Fenk ........................................ | 455/318 |
| 4,720,685 | 1/1988 | Gartus .................................... | 330/149 |
| 5,039,891 | 8/1991 | Wen et al. .............................. | 327/113 |

FOREIGN PATENT DOCUMENTS 2005101  4/1979  United Kingdom .

OTHER PUBLICATIONS

Zinke, Otto, *Lehrbuch der Hochfrequenztechnik*, Berlin, Heidelberg, New York, Tokyo: Springer, 3$^{rd}$ ed, vol. 2, ISBN 0–387–17042–1, p. 229.

*Primary Examiner*—Dinh T. Le
*Attorney, Agent, or Firm*—Proskauer Rose LLP

[57] ABSTRACT

A differential phase splitter circuit for producing opposite phase signals from an input AC signal is provided. A first and second transistor is provided. The source of these transistors are connected to a common first node. Further, these transistors act as a differential amplifier. The gate of the first transistor receives an input AC signal. The drain of the first transistor produces a first output AC signal. Similarly, the drain of the second transistor produces a second output AC signal that is 180 degrees out of phase with the first output AC signal. A source resistor is provided, connected in series to the common first node and ground. Lastly, an LCR feedback circuit is provided. This feedback circuit is connected between the drain of the first transistor and the gate of the second transistor. The LCR feedback circuit couples at least a fraction of the amplitude of the first output AC signal to the gate of the second transistor for amplitude balancing and phase balancing. This compensates for an unequal division of the input signal between the first and second transistor due to the finite impedance value of the source resistor. The LCR feedback circuit may include an active element for modifying the phase and amplitude balance of the two output AC signals. The active element may be adjusted using a control voltage.

8 Claims, 8 Drawing Sheets

ACCURATE AND TUNEABLE ACTIVE DIFFERENTIAL PHASE SPLITTERS IN RFIC WIRELESS APPLICATIONS

RELATED APPLICATION

The present invention relates to phase splitting circuitry, and, more particularly, to phase splitting circuitry implemented using active components with a feedback circuit.

BACKGROUND OF THE INVENTION

In balanced RFIC (Radio Frequency Integrated Circuit) mixer design, it is often desirable to split an incoming Radio Frequency (RF) signal into two differential signals. Optimally, these differential signals should be 180° out of phase and equal in amplitude.

The prior art has proposed several phase splitting circuits for accomplishing these goals. The ideal phase splitter will generate two differential signals from one RF signal. These signals will be as close to 180° out of phase as possible while having as close to equal amplitude as possible. The output signals do not need to be the same amplitude as the input signal. If generated differential signals are more or less than 180° out of phase, the signals are said to be unbalanced by that difference. Similarly, the generated differential signals are also said to be unbalanced by the amount their amplitudes differ in decibels.

The phase splitter has been implemented using either passive or active components. However, passive components, such as capacitors and inductors, tend to be lossy in RFICs. Additionally, they are ill suited for broad band applications. Moreover, since they occupy a large die area, they are more expensive than their active counterparts. Accordingly, it is often a goal in RFIC design to use active components whatsoever possible.

It Is especially important to have balanced phase and amplitude of the differential signals in applications such as a double balanced up-mixer. Perfectly balanced signals to the mixer minimize the local signal (LO) leakage level at the RF input port and greatly simplify the design of LO filtering. It is therefore an additional goal of RFIC design to create a robust phase splitter circuit providing both accurate phase and amplitude balance.

FIG. 1A shows a prior art single FET phase splitter 100. The phase splitter 100 of FIG. 1A comprises a single FET 102, an input voltage $V_{INPUT}$ 104, and two output voltages, $V_{out1}$ 106, and $V_{out2}$ 108. $V_{out1}$ 106 should optimally be 180° out of phase with $V_{out2}$ 108. This may be accomplished if this circuit is used at low frequencies. However, this phase splitter is unable to operate at higher frequencies, which is required in most RF applications. Adding sophisticated imbalance circuitry solves this deficiency to some extent. This circuitry is detailed in M. Goldfarb et al., *A Novel MMIC Biphase Modulator with Variable Gain Using Enhancement-Mode FETs suitable for 3v Wireless Applications*, p. 99, PROC. 1994, IEEE, MICROWAVE AND MILLIMETER-WAVE MONOLITHIC CIRS. SYMP. However, there may still be a 1 dB amplitude unbalance and an 8° phase unbalance when the circuit is operating between 700 MHz and 1.7 GHz. Moreover, the ability to operate at high frequency is achieved only with greater circuit complexity, increased die area, and increased current consumption. This circuit, therefore, is unacceptable for use in higher frequency RFIC design.

In FIG. 1B, another active phase splitter 120 is shown. This circuit was used in the article by L. Devlin et al., *A 2.4 GHz Single Chip Transceiver*, p. 23, PROC. 1993 IEEE MICROWAVE AND MILLIMETER-WAVE MONOLITHIC CIRS. SYMP. Two transistors 126 and 128 are provided which are connected in a common gate and common source configuration, respectively. The input signal is coupled to the source of transistor 126 through an AC coupling capacitor 122. At the same time, the input signal is fed to the gate of transistor 128. An AC bypass capacitor 124 is provided to bypass the biasing resistor 129. However, in this configuration, the AC coupling capacitance and the bypass capacitance 122, 124 need to be adjusted separately at each specific operating frequency. Accordingly, although this circuit may achieve less than 0.5 dB amplitude unbalance and ±5° phase unbalance, it is applicable only in narrow band applications, due to the necessity of separately tuning each capacitor.

FIG. 1C shows a differential amplifier configured as a phase splitter. The impedance at node $S_1$ 149 is critical in balancing the outputs $V_{out1}$ 144 and $V_{out2}$ 146. Each transistor should ideally receive an equal portion of the input signal. To accomplish this, the impedance at node $S_1$ 149 should be as large as possible or be implemented using as large an $R_s$ as possible. This may be accomplished if $R_s$ 132 is replaced with a constant current source that has infinite impedance. Thus, using a common current source in place of $R_s$ 132, transistors 140, 142 will receive the same amount of input signal and both outputs 144, 146 will be balanced.

The two transistors 140, 142 will receive the same amount of input signal due to the infinite impedance of the current source. Because of this, the AC input signal drops across the input impedance of transistors 140, 142 equally. Assuming the same DC bias point, transistors 140, 142 should have the same input impedance. Accordingly, assuming $R_s$ to be infinite, $v_{gs1} = -v_{gs2}$. This effectively reduces the circuit 130 to a simple voltage divider circuit, and therefore the following relationship holds true:

$$v_{gs_1} = -v_{gs_2} = \frac{v_{INPUT}}{2} \qquad (1)$$

Thus, each transistor 140, 142 will receive half the input signal 138. Accordingly, the output signals 144, 146 will be 180° out of phase and equal in amplitude.

Unfortunately, in RFIC design it is not possible to replace $R_s$ with an ideal current source. A non-ideal current source such as active devices have strong parasitic characteristics at high frequencies. Further, typical wireless devices often have low $V_{dd}$ requirements. For example, in a typical portable wireless communications application, $V_{dd}$ may be less than 3 volts or even 2 volts. Accordingly, it may not be feasible in most portable wireless applications to have an on-chip current source in place of $R_s$, since the biasing voltage $V_{ds}$ across the drain and source of the current source transistor should be 1 volt to 1.5 volts. This circuit may, however, be used in portable wireless applications with a low $V_{dd}$ requirement if the value of $R_s$ is limited.

As previously mentioned, an infinite $R_s$ is desirable because, as $R_s$ approaches infinity, the above mentioned relationship of $v_{gs1} = -v_{gs2}$ exists, and the output signals will be completely balanced. At the other extreme, as $R_s$ approaches 0, the source of transistor 140 will effectively short circuit to ground, and the input voltage drop across transistor 142 will also approach 0. Therefore, at small values of $R_s$, $v_{gs2}$ will approach 0, and $v_{gs1}$ will approach $V_{INPUT}$. In general cases, $|v_{gs1}| > |v_{gs2}|$. Therefore, a balanced differential signal using the circuit 130 is typically not feasible.

The circuit 150 of FIG. 1D shows the circuit of FIG. 1C with typical values for the individual components inserted. This circuit was used to produce the plot shown in FIG. 1E. The plot 180 shown in FIG. 1E represents the simulated amplitude and phase differences between the output signals $V_{O1}$ 170 and $V_{O2}$ 172. As shown by the curve 182, the amplitude of output $V_{O1}$ is larger than that of output $V_{O2}$ by 6~8 dB. Moreover, as further shown by curve 184, the phase differences range between 180° to 163° at higher frequencies. This wide range of unbalance in the phase and amplitude is a result of the difficulties mentioned above in choosing a value for $R_s$.

One solution to this problem proposed in U.S. Pat. No. 5,068,621 is to compensate for or bypass some of the input signal $V_{INPUT}$. A circuit 190 implementing this solution is depicted in FIG. 1F where part of the input signal is fed via impedance Z2 to the source of each transistor 192, 194. Preferably, Z2 is selected in relation to the source impedance $Z1=R_s$ so as to cancel any current that would otherwise flow through $R_s$. However, the circuits implementing this solution are not capable of adjusting amplitude and phase differences separately. Moreover, these circuits are even more complicated to design and implement than the differential circuit.

Accordingly, it is an object of the present invention to overcome the disadvantages of the prior art.

SUMMARY OF THE INVENTION

This and other objects are achieved by the present invention. Preferably, in a phase splitter circuit an LRC feedback circuit is connected from an output of a first transistor to an input of a second transistor. By selecting appropriate values for the components of the feedback circuit, differential signals having balanced phase and amplitude are achieved.

According to one embodiment, a differential phase splitter circuit for producing opposite phase signals from an input AC signal is provided with first and second transistors. The sources of these transistors are connected to a common first node. An input AC signal is applied to the gate of the first transistor. The drain of the first transistor produces a first output AC signal. Similarly, the drain of the second transistor produces a second output AC signal that is 180° out of phase with the first output AC signal. A source resistor is provided, connected in series between the common first node and ground. A feedback circuit is connected between the drain of the first transistor and the gate of the second transistor. The feedback circuitry couples at least a fraction of the amplitude of the first output AC signal to the gate of the second transistor. This compensates for an unequal division of the input signal between the first and second transistor due to the limited resistance of the source resistor.

In another embodiment of the invention, an input impedance matching circuit for optimizing the phase splitter circuit for narrow band operation is provided.

In yet another embodiment of the invention, the feedback circuit comprises a capacitor and inductor in series, where the capacitor blocks a DC supply voltage, and the inductor compensates for the phase lag due to the capacitor.

In another embodiment, the feedback circuit comprises two resistors connected in series, where the ratio of the two resistors may be adjusted in order to adjust the amplitude unbalance.

In a last embodiment of the invention, an active feedback circuit for modifying the phase and amplitude balance of the two output AC signals is provided, depending on a control voltage applied to the active circuit.

DETAILED DESCRIPTION OF THE INVENTION

According to the present invention, a differential phase splitter is provided with feedback circuitry. Four embodiments are described below. In the first embodiment, the feedback circuitry is comprised of passive components in series, connecting the drain of a first transistor in the differential transistor pair to the gate of a second transistor in the differential transistor pair. In a second embodiment, an input impedance matching circuit is provided. In a third embodiment, the load resistors are replaced with active elements. In a fourth embodiment, a transistor is provided in series with the passive elements above, connected to a DC voltage $V_B$. $V_B$ is tunable so as to vary the amplitude and phase balance of the output signals. Each of these embodiments is described separately below.

The Differential Phase Splitter Circuit With an LCR Feedback Balancing Circuit

Figure 2A:
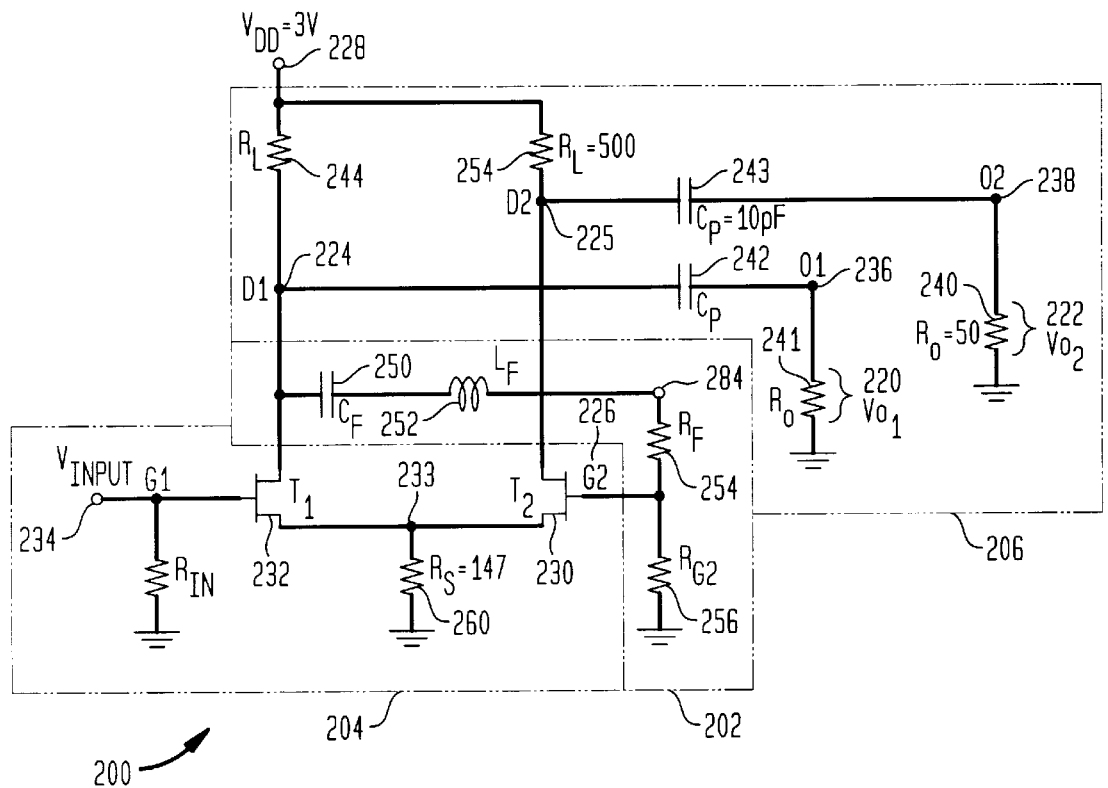
FIG. 2A shows a first embodiment of the present invention.

FIG. 2A shows a circuit 200 according to a first embodiment of the present invention. The circuit 200 comprises a differential transistor pair 204, output circuitry 206, and feedback circuitry 202.

The output circuitry comprises two load impedances (RL) 244, 254 which are connected to the differential transistor pair as described below. These load impedances receive a DC signal 228. Connected to the same node 224 as load impedance 244 is a capacitor 242 for AC coupling, and an output impedance ($R_O$) 241 connected in series with capacitor 242. Similarly, connected to the same node 225 as load impedance 254 is a capacitor 243 for AC coupling, and an output impedance ($R_O$) 240 connected in series with capacitor 243.

The differential pair comprises a first transistor 232 and second transistor 230. The sources of these transistors 232, 230 are connected to a common node 233. A source resistor $R_s$ 260 is provided in series with the sources of transistors 232, 230 and ground. An input voltage $V_{INPUT}$ 234 is applied to the gate of the first transistor 232. The drain of first transistor 232 is connected to load impedance 244 at node 224. Similarly, the drain of the second transistor 230 is connected to load impedance 254 and node 225. The drain of first transistor 232 produces a first output AC signal, while the drain of the second transistor 230 produces a second output AC signal. A fraction of the first output AC signal is fed back to the gate of the second transistor 230 through feedback circuitry 202, as described below.

Figure 2B:
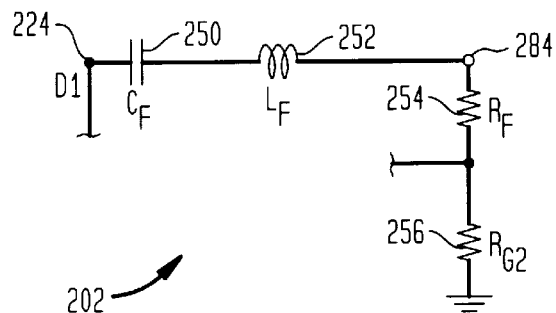
FIG. 2B shows the feedback circuit of the circuit shown in FIG. 2A.

The feedback circuitry 202 of FIG. 2A is reproduced in FIG. 2B for clarity. The feedback circuitry 202 is connected between the drain of the first transistor 232, and the gate of the second transistor 230. The feedback circuitry comprises feedback capacitor $C_F$ 250 connected in series with a feedback inductor $L_F$ 252, a feedback resistor $R_F$ 254, and a gate resistor $R_{G2}$ 256. The gate of the second transistor 230 is connected to the feedback circuit 202 between the two resistors 254, 256. The feedback circuitry 202 is provided because source resistor 260 causes a disproportionate amount of $V_{INPUT}$234 to be realized across transistors 232, 230. Accordingly, by feeding some of the output from the drain of the first transistor 232 to the gate of the second transistor 230 through the feedback circuit 202, the output at $v_{O1}$ 220 is reduced, while the output at $v_{O2}$ 222 is increased. This feedback circuit thus compensates for the disproportionate current realized across transistors 232, 230, due to the limited impedance of source resistor 260.

The remaining components of the feedback circuit 202 are as follows. The gate resistor 256 biases the second transistor 230 to the same gate potential as that of first transistor 232. The feedback capacitor 250 blocks the DC component of the voltage at D1 so that the DC biasing voltage applied to transistor 230 will not be affected by voltage at D1. As is known, the feedback capacitor 250 will introduce a lagging phase shift into the AC component of the voltage it passes. The feedback inductor 252 counteracts the phase shift of the signal traveling through feedback capacitor 250. The values of the feedback capacitor 250 and feedback inductor 252 are preferably chosen as follows.

Assuming an application specific frequency ω, the values of feedback capacitor $C_F$ 250 and feedback inductor 252 $L_F$ should be chosen so that the following relationship holds true:

$$L_F \cdot C_F = \frac{1}{\omega^2} \quad (2)$$

Figure 2C:
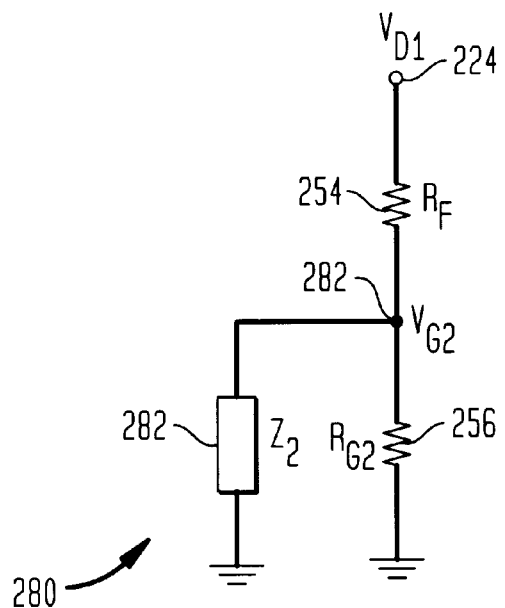
FIG. 2C shows an AC equivalent of the circuit shown in FIG. 2B.

Note that ω is the resonant frequency of the capacitor and inductor in series. If the values are chosen to satisfy this equation, any phase delay from node 224 to 284 is canceled. This is due to the fact that a series LC circuit following equation (2) gives a zero reactance at its resonant frequency. If the values of feedback capacitor 250 and feedback inductor 252 are chosen correctly, and the reactance of the series LC circuit is accordingly zero, the circuit 202 of FIG. 2B may be reduced to the AC equivalent circuit 280 as shown in FIG. 2C for signals having the frequency ω. The impedance 282 is the equivalent input impedance of transistor 230 for input signals having the frequency ω. Accordingly, AC signals $v_{G2}$ 282 and $v_{D1}$ 224 will have the following relation:

$$V_{G2} = V_{D1} \cdot \frac{R_{G2} \| Z_2}{R_F + R_{G2} \| Z_2} \quad (3)$$

Where "$\|$" means in parallel with. Equation (3) means by properly choosing the ratio of $R_F$ to $R_{G2}$, $v_{G2}$ will be adjusted and hence the $v_{O2}$ 222 will be adjusted. Thus, amplitude unbalance will be cancelled. Furthermore, the feedback circuitry 202 is also capable of tuning the phase balance. This may be accomplished by adjusting the values of the capacitor 250 and inductor 252 accordingly. For example, the reactance of the feedback circuit between node D1 224 and node 284 in FIG. 2A is given by the following:

$$X_F = \omega \cdot L_F - \frac{1}{\omega \cdot C_F} \quad (4)$$

The value of reactance $X_F$ may be positive (inductive), zero (resistive), or negative (capacitive). This may be accomplished by adjusting the values of the capacitor 250 and inductor 252 at the application frequency ω. By choosing these values accordingly, phase unbalance at output ports 236, 238 in FIG. 2A may be effectively canceled.

Phase tuning may be accomplished either linearly or non-linearly. As may be seen from Eq. (4), phase tuning may be accomplished linearly by adjusting $L_F$ and keeping $C_F$ constant. This is true since $X_F$ is proportional to $L_F$ when $C_F$ remains constant. Additionally, the phase may be adjusted non-linearly by adjusting $C_F$, and either adjusting $L_F$ or keeping it the same.

Additional factors that may be considered when choosing a value for either feedback capacitor 250 or feedback inductor 252 (or both) will be consideration of the available die area, phase tuning sensitivity, and process tolerance. It should also be noted that, in practical applications, in choosing a value for the resistive part, the Q factor of the inductor is largely irrelevant. Although the inductor may have a resistive aspect, this resistive aspect of the inductor 252 may be considered as part of the resistor 254 in the feedback circuit 202 of FIG. 2B.

Moreover, when choosing the values of the elements of the feedback circuit 202, the output impedances 240, 241 should be known. Illustratively, when the output impedance 241 is 0Ω, $V_{D1}$ 224 is coupled to ground through capacitor 242. When the output impedance 241 is open (i.e., infinity Ω), AC signal at D1 will go through the feedback circuit path only. Thus, when designing the feedback circuit, the output termination impedances 240, 241 should be known. This is generally true in RFIC design.

As an illustration of one effect the output impedance may have on the choice of values for the feedback element, an experiment using two output impedances was conducted. The first experiment used an output impedance ($R_o$) of 50Ω, while the second used an output impedance of 500Ω. The higher impedance represents a typical input impedance of a next stage on-chip amplifier. In the experiment, the circuit shown in FIG. 1D was compared with the circuit disclosed in FIG. 2A. Two frequencies were tested: 1.67 GHz and 5.80 GHz. In both experiments, circuit 200 of FIG. 2A had first and second transistors 232, 230 having channel widths=75 μm and channel lengths=0.5 μm. In the first experiment using the 50Ω output impedance, capacitor 250=9.10 pF, inductor 252=1.01 nH, resistor 254=16Ω, and resistor 256= 51Ω. In the second experiment utilizing a 500Ωoutput impedance, capacitor 250=2.30 pF, inductor 252=0.13 nH, resistor 254=208Ω, and resistor 256=51Ω. Node $O_1$ is shown in FIG. 2A at 236, and at 170 in FIG. 1D. Node $O_2$ is shown in FIG. 2A at 238, and in FIG. 1D at 172.

Figure 1A:
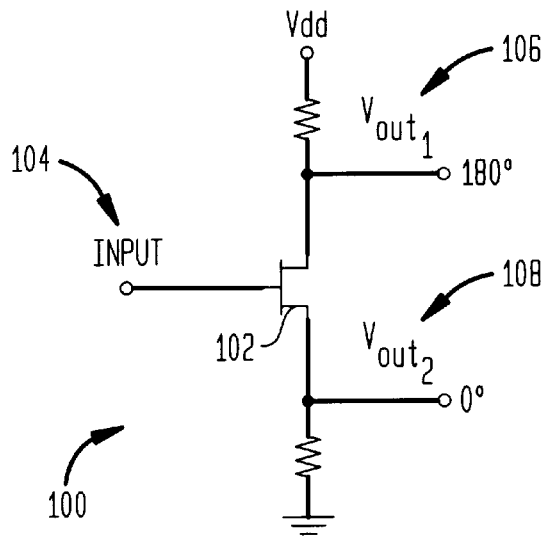
FIG. 1A shows a first prior art phase splitter.
Figure 1B:
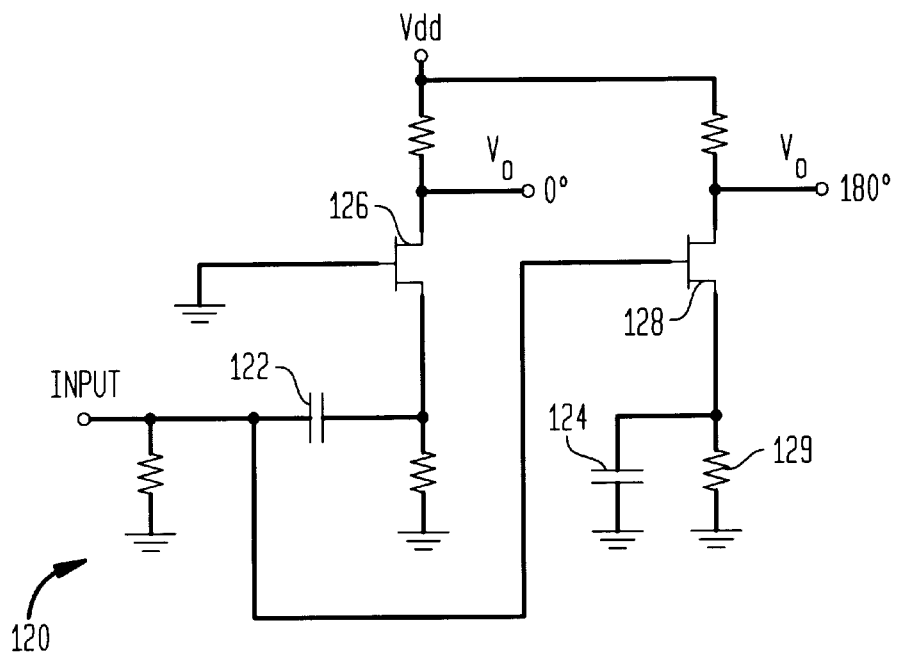
FIG. 1B shows a second prior art phase splitter.
Figure 1C:
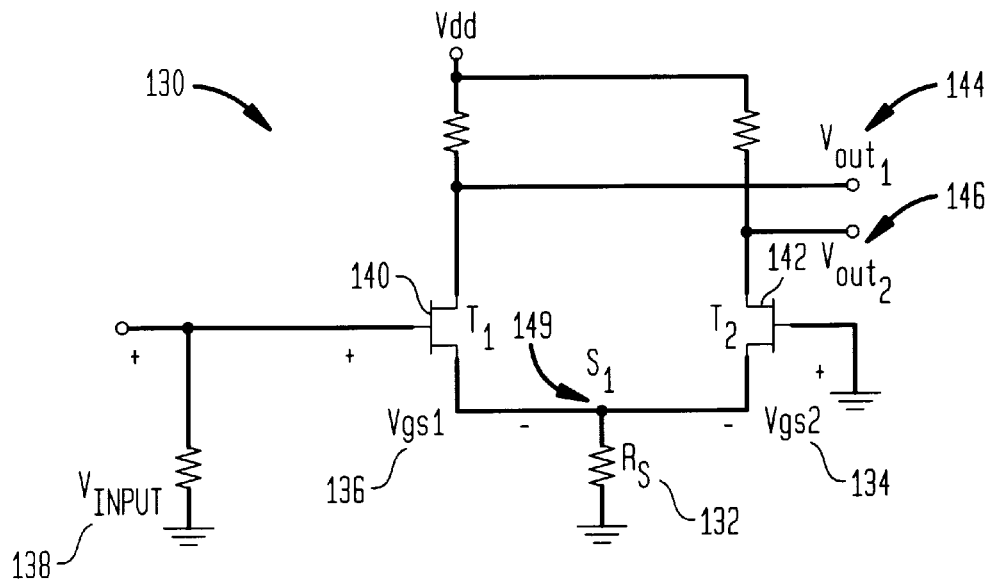
FIG. 1C shows a third prior art phase splitter.
Figure 1F:
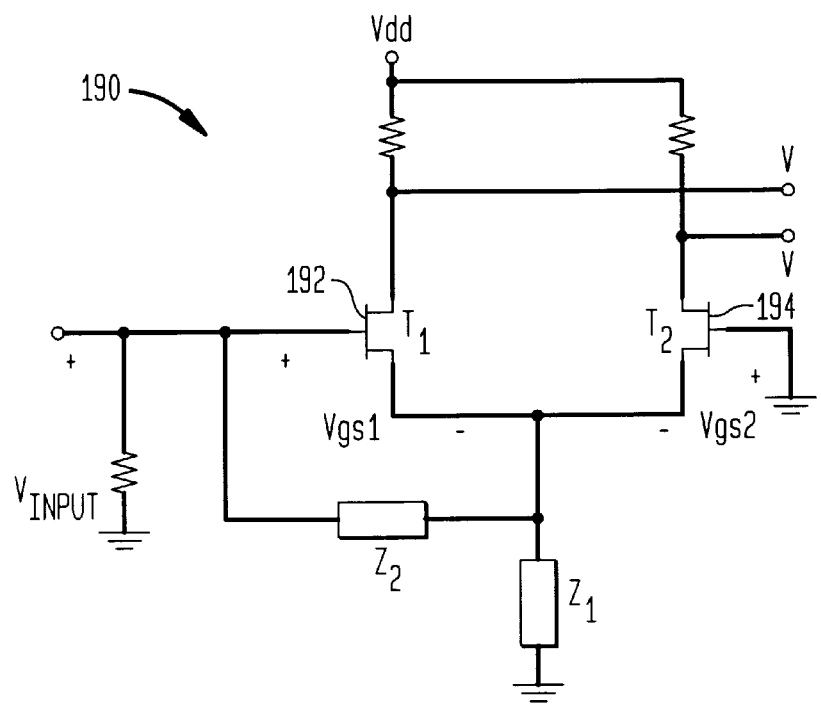
FIG. 1F shows the circuit of FIG. 1C with the addition of bypass circuitry.
Figure 1D:
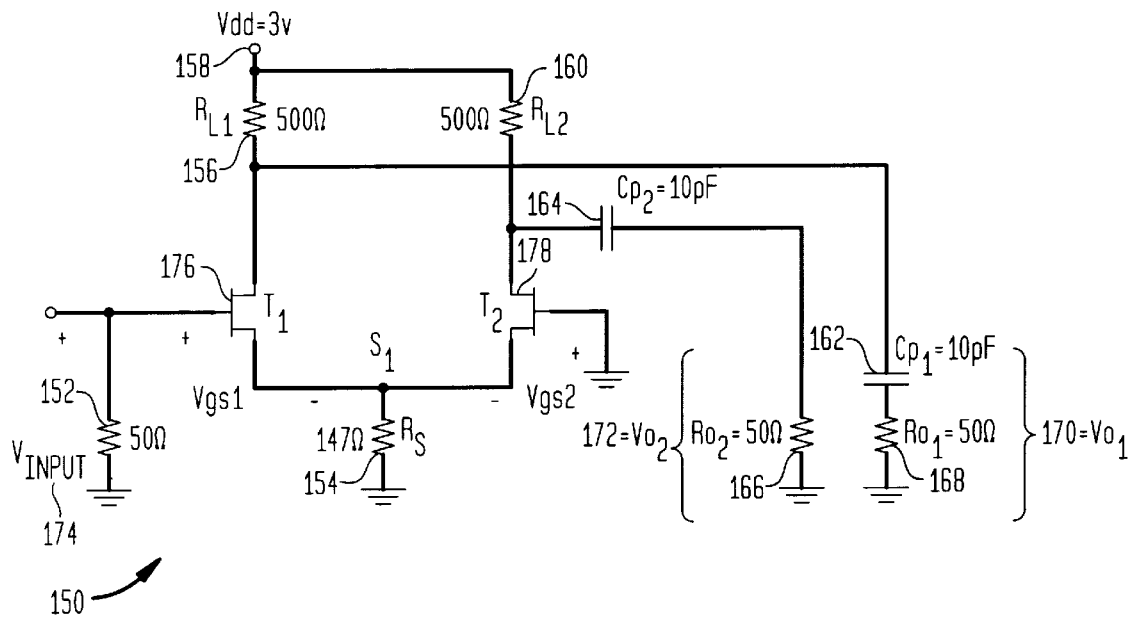
FIG. 1D shows a fourth prior art phase splitter.
Figure 1E:
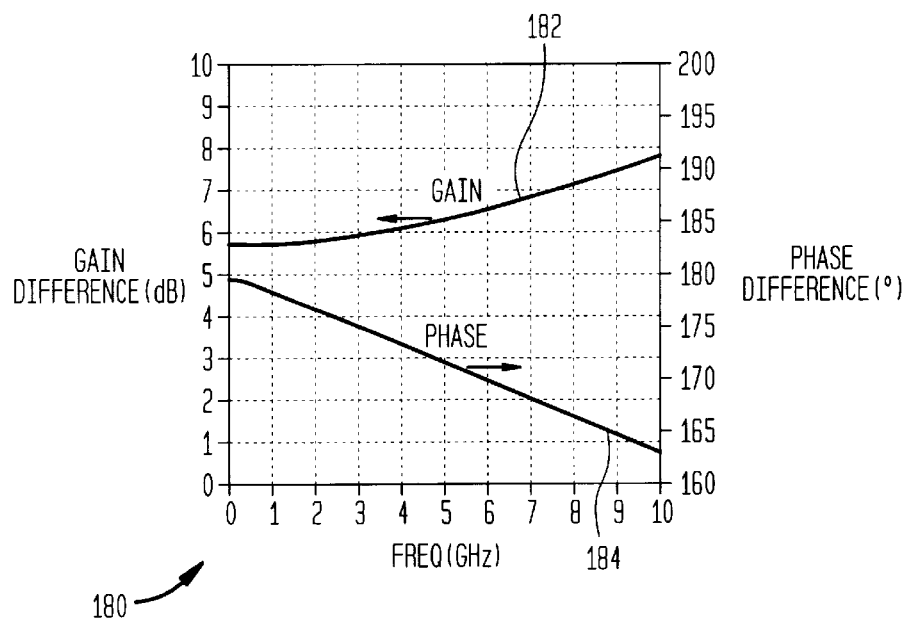
FIG. 1E shows a plot of experimental data obtained from the prior art circuit of FIG. 1D.
Figure 2D:
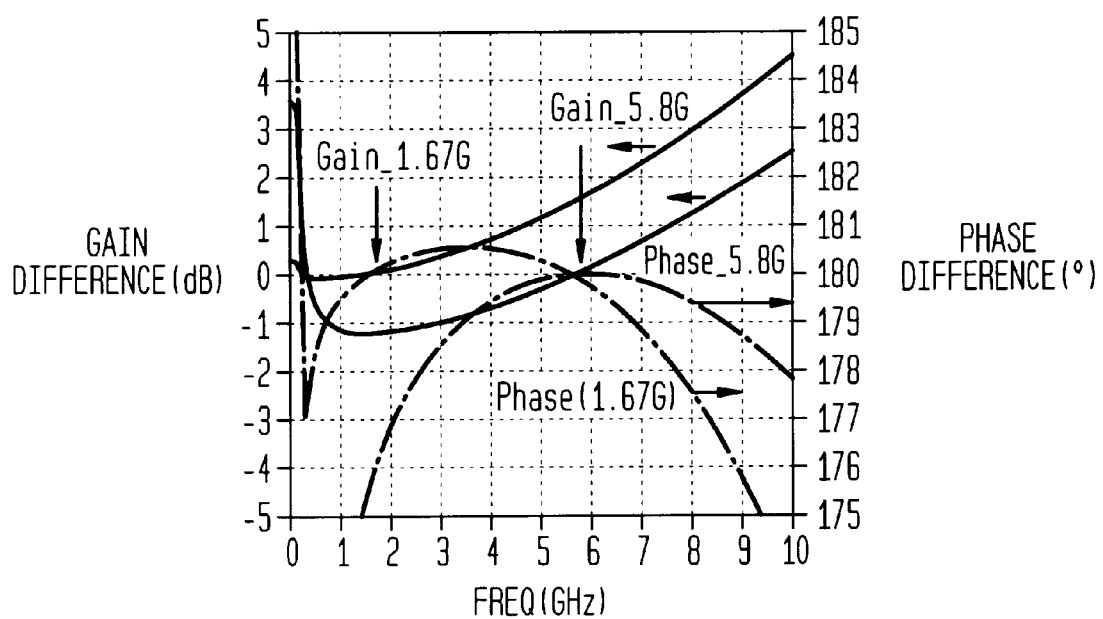
FIG. 2D shows a plot of experimental data obtained from the circuit of 2A.

| Circuit used | Voltage Gain at node O1 | Voltage gain at node O2 | Δ Gain (dB) | Phase of Voltage at O1 | Phase of Voltage at O2 | Δ phase (Degrees) |
|---|---|---|---|---|---|---|
| FIG. 2D @ 1.67 GHz | −13.1 | −18.5 | 5.43 | 163.30 | −12.46 | 175.76 |
| FIG. 2A @ 1.67 GHz | −17.01 | −17.02 | −0.004 | 174.07 | −6.08 | 180.15 |
| FIG. 1D @ 5.80 GHz | −12.89 | −18.46 | 5.57 | 154.01 | −12.01 | 166.02 |
| FIG. 2A @ 5.80 GHz | −4.134 | −4.129 | −0.004 | 134.52 | −45.43 | 179.95 |

As indicated by the above chart, there is only a −0.004 dB amplitude unbalance in the circuit of the present invention between node $O_1$ and $O_2$ at 1.67 GHz. Similarly, there is only a 0.15° phase unbalance in the circuit at 1.67 GHz, and 0.05° phase unbalance at 5.80 GHz. Conversely, the prior art circuit has an amplitude unbalance of 5.43 dB between nodes $O_1$ and $O_2$. The phase unbalance is similarly significantly larger when compared to the circuit of the present invention. At 1.67 GHz, the phase unbalance of the prior art circuit is 4.24°. Similarly, at 5.80 GHz, the phase unbalance is 13.98°.

FIG. 2D summarizes the characteristics of the circuit shown in FIG. 2A. FIG. 2D shows the gain and phase differences versus frequency for the circuits optimized at 1.67 GHz and 5.8 GHz.

Moreover, although the above circuit shown in FIG. 2A has been optimized for a specific frequency, it also has excellent response in a wide frequency range. In two experiments using different frequencies, an output impedance of 500Ω, and the following values for the elements of the circuit, an amplitude unbalance of less than 1 dB and a phase unbalance of ±1° was attained. In the first experiment, the circuit was optimized for 1.67 MHz, the capacitor 250=9.58 pF, the inductor 252=1.98 nH, the resistor 254=295Ω, and the resistor 256=51Ω. In the second experiment, the circuit was optimized for 5.8 MHz, the capacitor 250=3.40 pF, the inductor 252=0.130 nH, the resistor 254=208Ω, and the resistor 256=51Ω.

| Circuit used | Frequency circuit was optimized for | Low Frequency | High Frequency | Bandwidth |
|---|---|---|---|---|
| FIG. 2A | 1.67 GHz | 0.8 GHz | 4.8 GHz | 4.0 GHz |
| FIG. 2A | 5.80 GHz | 3.6 GHz | 7.8 GHz | 4.2 Ghz |

As seen from the above chart, the circuit of the present invention has roughly 4.0 GHz bandwidth for the circuits optimized at 1.67 GHz and 5.80 GHz. However, if the circuit is optimized specifically for wide-band applications rather than a particular frequency, an unbalance of ±1 dB and ±1° phase can easily be achieved within a 5 GHz bandwidth. This bandwidth is sufficient to encompass all the frequencies currently used in various commercial wireless communication systems.

Figure 3:
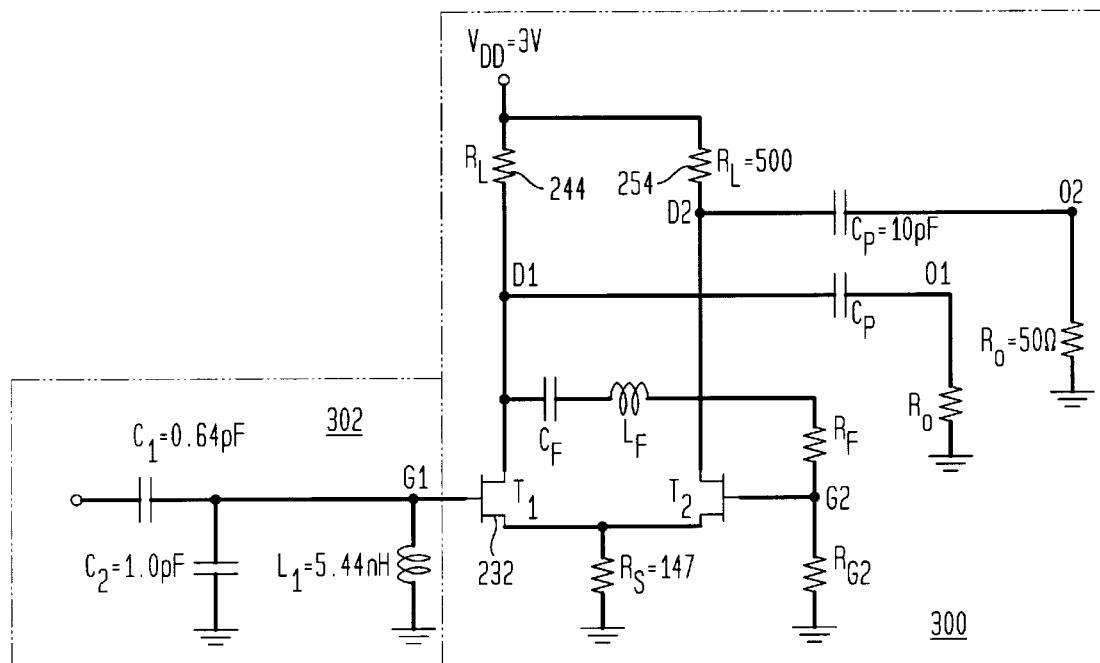
FIG. 3 shows a second embodiment of the present invention.

The Differential Phase Splitter Circuit With an LCR Feedback Balancing Circuit and Input Impedance Matching Circuit In a second embodiment of the present invention, the phase splitter of FIG. 2A is further optimized for narrow band operation by the addition of an input impedance matching circuit. The input impedance matching circuitry accomplishes this by further modifying the frequency response of the phase splitter circuitry to match an application specific frequency. This allows maximum power transfer at the specific application frequency. For example, an input matching circuit may be optimized for maximum power transfer at 1.67 GHz. FIG. 3 depicts the circuit 300 of FIG. 2A with a matching circuit 302. As seen in FIG. 3, the impedance matching circuit 302 preferably comprises a first matching capacitor $C_1$, a second matching capacitor $C_2$, and a matching inductor $L_1$. The impedance matching circuit replaces $R_{IN}$ for the first transistor 232. The second matching capacitor $C_2$ matching inductor $L_1$ are connected in parallel.

The following table summarizes the gain and phase differences between the circuit of FIG. 2A, and the circuit of FIG. 3. In this experiment, the output impedance of the phase splitter was 500Ω, the feedback capacitor 250=7.99 pF, the feedback inductor 252=1.01 nH, the feedback resistor 254=295Ω, and the gate resistor 256=54Ω.

| Circuit used | Voltage Gain at node O1 | Voltage gain at node O2 | Δ Gain (dB) | Phase of Voltage at O1 | Phase of Voltage at O2 | Δ phase (Degrees) |
|---|---|---|---|---|---|---|
| FIG. 2A | −2.897 | −2.901 | −.0034 | 166.28 | −13.73 | 180.01 |
| FIG. 3 | 6.585 | 6.608 | −0.023 | −122.62 | 57.83 | 180.44 |

Figure 4:
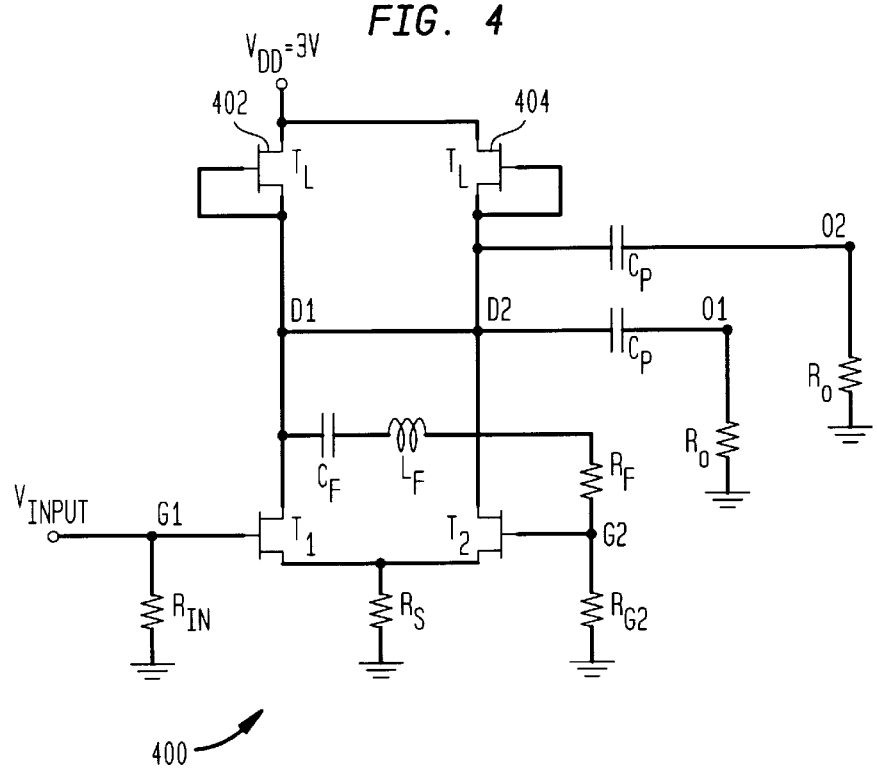
FIG. 4 shows a third embodiment of the present invention.

The Differential Phase Splitter Circuit With an LCR Feedback Balancing Circuit and Active Loads FIG. 4 shows a third embodiment 400 of the invention. As seen in FIG. 4, the passive load impedances ($R_L$) 244, 254 of FIG. 2A and FIG. 3 are replaced with active loads. The diode connected transistors 402 and 404 of the circuit 400 are in depletion mode. Further, they are illustratively FETs with a negative pinch-off voltage. The active loads have the advantage of allowing a higher voltage gain. However, they are easily saturated.

Resistance of the Above Circuitry Against Process Fluctuation

One of the many problems associated with IC fabrication is the tolerances of individual components. That is, the specific electrical characteristics of each component usually cannot be made precise although the characteristics can usually be forced to lie within a given range or tolerance.

Known as process fluctuation, this may seriously degrade the performance of IC circuitry. However, it should be noted that, inherent in the design of the present invention is a resistance to process fluctuation. This is due to the symmetrical topology in both circuit configuration and the layout pattern. In other words, any variation is likely to be approximately the same in each branch of the differential pair, and thus cancel. For example, in a worst case scenario, where the unbalances of the components are accumulated rather than canceled, the gain unbalance may be as small as 1 dB, while the phase unbalance may be as small as 1°.

Figure 5A:
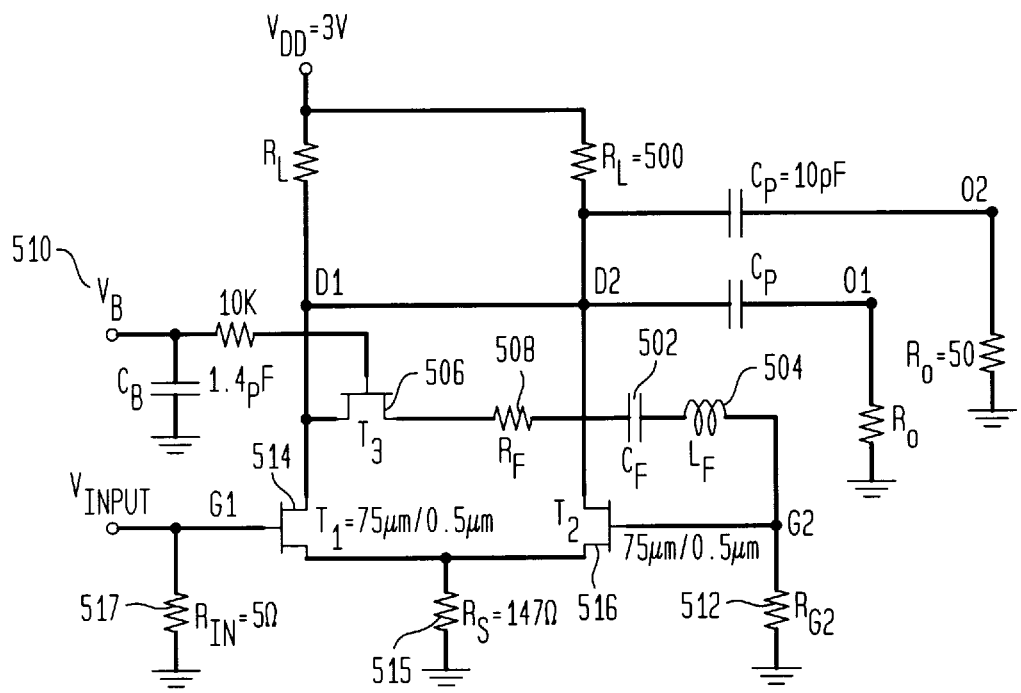
FIG. 5A shows a fourth embodiment of the present invention.
Figure 5B:
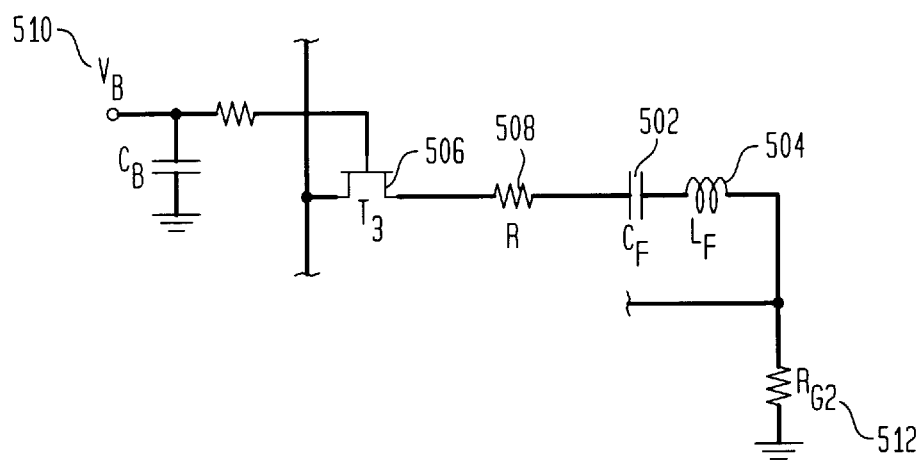
FIG. 5B shows the active feedback circuit of the circuit shown in FIG. 5A.

The Differential Phase Splitter Circuit With a Tunable Active Feedback Balancing Circuit However, the feedback circuitry 202 is not symmetrical, and does not possess the same inherent resistance to process fluctuation. Accordingly, in high performance RF applications, it may become desirable to further cancel unbalance caused by process fluctuation. Accordingly, a fourth embodiment of the present invention is provided in which the feedback balancing circuit is comprised of active elements and a tunable voltage source. This fourth embodiment is shown in FIG. 5A. FIG. 5B depicts the feedback circuitry of FIG. 5A alone for clarity.

In this configuration, the feedback capacitor 502 and the feedback inductor 504 still provide DC blocking and AC phase tuning, as discussed above. However, feedback transistor 506 is added in series with feedback resistor 508. Feedback transistor 506 is illustratively a MESFET. Externally tunable DC voltage $V_B$ 510 is also provided. When adjusted, this voltage 510 will vary the channel resistance of the feedback transistor 506. Accordingly, the serially connected feedback transistor 506 and feedback resistor 508 may be considered as a combined single feedback resistance. In designing the circuit 500 of FIG. 5A, the size of feedback transistor 506, feedback resistor 508, and gate resistor 512 are chosen in such away that the external tuning of $V_B$ 510 will vary the gain and phase balance within a specific small range, centered on the balance point. In this way, the effects of process fluctuation may effectively be canceled.

Figure 5C:
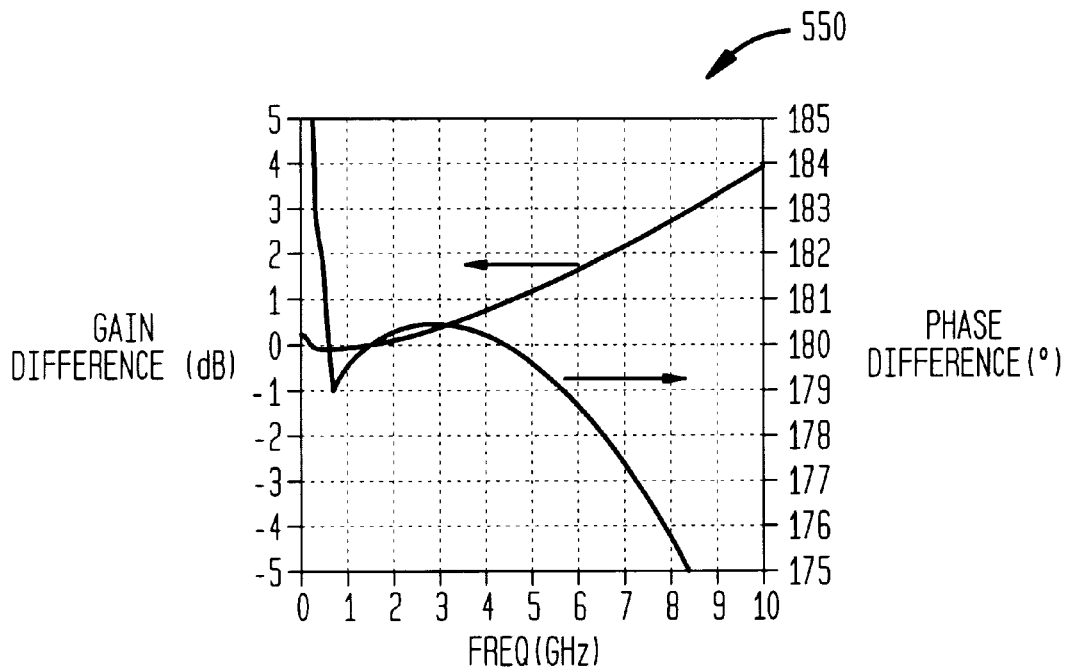
FIG. 5C shows a plot of experimental data obtained from the circuit of FIG. 5A.
Figure 5D:
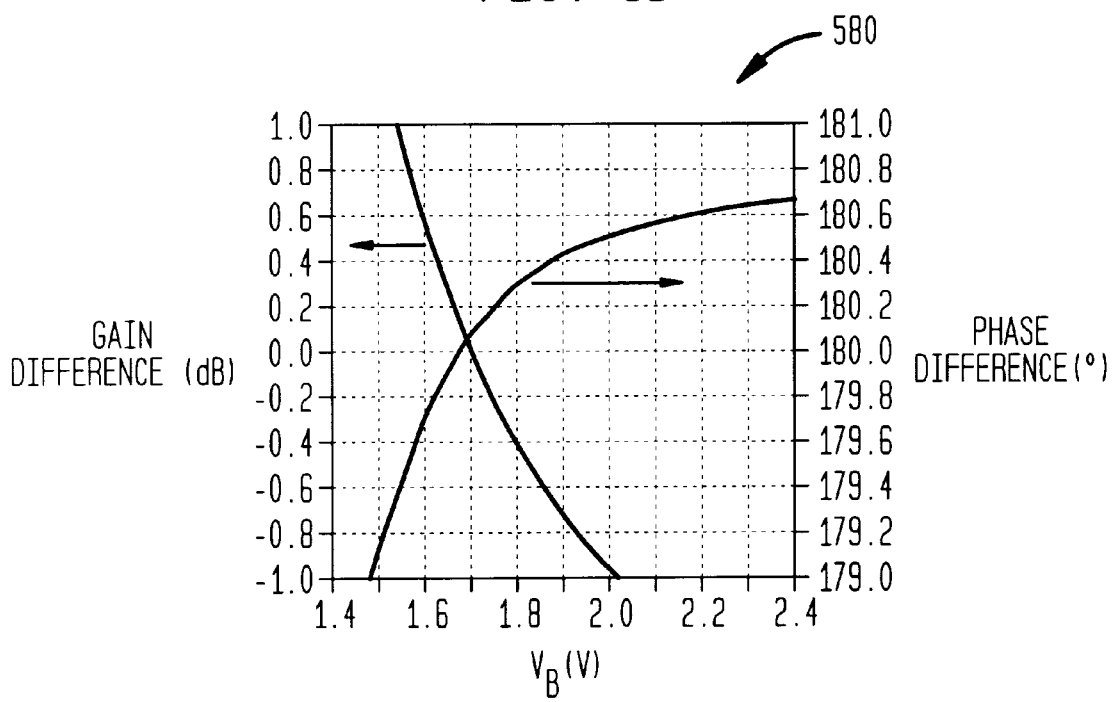
FIG. 5D shows a second plot of experimental data obtained from the circuit of FIG. 5A.

FIG. 5C is a graph 550 showing the simulation results of the tunable phase splitter optimized at 1.67 GHz. FIG. 5D is a graph 580 showing the simulation results of the tuning performance. In this experiment, the initial $V_B$ value 510= 1.7V, while the channel resistance of transistor 506 is roughly 11Ω. The output impedance is 50Ω, the capacitor 502=8.10 pF, the inductor 504=1.01 nH, and the resistor 512=32Ω. The transistors 514, 516 both have a channel width of 75 μm and a channel length of 0.5 μm. The source resistor 515=147Ω, the input resistance 517=50Ω, while the tuning capacitor 520=1.4 pF. The results obtained from this experiment was a gain unbalance of 0.01 dB, and a phase difference of 180.1°. By tuning the voltage $V_B$ 510 from 1.5V to 1.9V, the gain unbalance will vary from +1 dB to -1 dB, and the phase difference will change from 179.16° to 180.42°. Accordingly, the unbalance caused by the process fluctuation can be very effectively canceled with the tunable differential phase splitter.

Finally, the above-discussion is intended to be merely illustrative of the invention. Numerous alternative embodiments may be devised by those having ordinary skill in the art without departing from the spirit and scope of the following claims. A person skilled in the readily recognizes that the disclosed invention may be implemented using MESFET, CMOS, bipolar, or other technology.

What is claimed is:

1. A phase splitter circuit for producing balanced opposite phase signals from an input AC signal, comprising:

first and second transistors, the source of said first and second transistors being connected to a common first node, wherein said first and second transistor operate as a differential amplifier, the gate of said first transistor receiving an input AC signal;

the drain of said first transistor producing a first output AC signal;

the drain of said second transistor producing a second output AC signal that is 180° out of phase with said first output AC signal;

a source resistor, said source resistor connected in series to said first node and ground; and a feedback circuit connected between the drain of said first transistor and the gate of said second transistor for coupling at least a fraction of an amplitude of said first output AC signal to said gate of said second transistor for tuning said amplitude and a phase between said first and second transistor.

2. The circuit of claim 1, wherein the feedback circuit further comprises two resistances connected in series, wherein a ratio of said resistance values is selected to cancel out amplitude unbalance.

3. The circuit of claim 1, wherein said feedback circuit further comprises a capacitor and an inductor connected in series, said capacitor for blocking a DC voltage of said first output, said inductor for compensating for a phase lag due to said capacitor.

4. The circuit of claim 3, wherein said feedback circuit further comprises an active circuit for canceling an unbalance caused by process fluctuation, wherein a channel resistance of said active circuit depends on a control voltage applied to said active circuit.

5. The circuit of claim 1, wherein said feedback circuit includes at least one of each of an inductor, capacitor, and resistor, and wherein said second output AC signal has the substantially same frequency and amplitude as said first AC signal.

6. The circuit of claim 3, wherein a value of each of said capacitor and inductor are selected to cancel out the phase unbalance between the first and second output AC signals.

7. The circuit of claim 2, wherein said two resistances comprises a first end at one resistance and a second end at the other resistance, wherein said first end being connected to said capacitor and inductor of said feedback circuit, said second end being connected to ground, and the gate of said second transistor being connected in between the two resistances.

8. The circuit of claim 4, wherein said active circuit replaces said two resistances, such that said a channel resistance of said active circuit is adjustable by controlling a DC biasing voltage thereto.

* * * * *